(12) United States Patent
Kim

(10) Patent No.: US 7,936,121 B2
(45) Date of Patent: May 3, 2011

(54) ORGANIC LIGHT EMITTING DISPLAY DEVICE

(75) Inventor: Hyeong-gwon Kim, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 328 days.

(21) Appl. No.: 12/117,647

(22) Filed: May 8, 2008

(65) Prior Publication Data

US 2008/0278070 A1    Nov. 13, 2008

(30) Foreign Application Priority Data

May 10, 2007 (KR) .................. 10-2007-0045554

(51) Int. Cl.
*H01L 51/50* (2006.01)
(52) U.S. Cl. .................. 313/504; 257/100; 428/690
(58) Field of Classification Search .................. 313/504; 257/100; 428/690
See application file for complete search history.

(56) References Cited

U.S. PATENT DOCUMENTS

| | | | | |
|---|---|---|---|---|
| 6,888,237 | B1 * | 5/2005 | Guenther | 257/704 |
| 2002/0057052 | A1 * | 5/2002 | Kobayashi | 313/504 |
| 2004/0124765 | A1 * | 7/2004 | Iwase | 313/504 |
| 2004/0234813 | A1 * | 11/2004 | Lee et al. | 428/690 |

FOREIGN PATENT DOCUMENTS

| | | |
|---|---|---|
| JP | 1997-330792 | 12/1997 |
| JP | 2003-150316 | 5/2003 |
| JP | 2004-145878 | 5/2004 |
| KR | 20-0218684 | 1/2001 |
| KR | 10 2003-0055856 | 7/2003 |
| KR | 10 2004-0031512 | 4/2004 |
| KR | 1020060077898 A | 7/2006 |
| KR | 10-2006-0114595 | 11/2006 |
| KR | 10 2006-0114596 | 11/2006 |

OTHER PUBLICATIONS

Notice of Allowance for KR 9-5-2008-019633501, dated Apr. 10, 2008.

* cited by examiner

*Primary Examiner* — Nimeshkumar D Patel
*Assistant Examiner* — Mary Ellen Bowman
(74) *Attorney, Agent, or Firm* — Knobbe, Martens, Olson & Bear, LLP

(57) ABSTRACT

An organic light emitting display device having a touch panel function comprises at least one organic light emitting diode and an encapsulating thin film for encapsulating the organic light emitting diode; and an external input device formed on the display panel for generating an electric signal in response to a touch operation applied from the exterior thereof. The external input device includes an upper substrate and a spacing member. The external input device has a third electrode formed on the display panel and a fourth electrode formed on the upper substrate to intersect the third electrode. The spacing member forms a predetermined spacing between the third electrode and the fourth electrode.

16 Claims, 11 Drawing Sheets

ORGANIC LIGHT EMITTING DISPLAY DEVICE

CROSS-REFERENCE TO RELATED APPLICATIONS

This application claims the benefit of Korean Patent Application No. 10-2007-0045554, filed on May 10, 2007 in the Korean Intellectual Property Office, the entire disclosure of which is incorporated herein by reference.

BACKGROUND

1. Technical Field

The present disclosure relates to an organic light emitting display device, more particularly to an organic light emitting display device having touch-panel functionality.

2. Discussion of Related Art

Recently, organic light emitting display devices have been widely used, and have relatively simple construction. Further, organic light emitting display devices can display text and graphics using an external input device. In general, an organic light emitting display device includes a first electrode, a second electrode, and at least one organic layer having an emission layer interposed between the first electrode and the second electrode. The first electrode is formed on a substrate and functions as an anode injecting holes. The organic layer is formed on the first electrode. The second electrode is formed on the organic layer facing the first electrode, and functions as a cathode injecting electrons.

Meanwhile, when an organic light emitting display device is exposed to moisture or oxygen, the emission layer may be damaged. So to protect an organic light emitting diode of the organic light emitting display device, an encapsulating substrate is provided on the substrate. The encapsulating substrate can be formed in a cavity or plate pattern, and can be made of glass or metal.

Furthermore, recently, an organic light emitting display device including a touch panel has been suggested. The touch panel is mounted on the organic light emitting display device and can perform various user interface functions for a screen operation in a display. In general, the touch panel includes an upper substrate, a lower substrate, and a spacing member. The upper substrate has an upper electrode. The lower substrate has a lower electrode. The spacing member spaces the upper substrate and the lower substrate apart from each other by a predetermined distance.

The following is an operation principle of the touch panel. By pressing the upper substrate using an input means such as a pen or a finger, the upper electrode formed on the upper substrate and the lower electrode formed on the lower substrate are electrically conducted therebetween. Accordingly, an electric signal is detected based on a resistance value of a contacted position, and a function of the touch panel is achieved using the detected electric signal.

However, when the touch panel manufactured as described above is adhered to the display panel, a process of adhering the touch panel to the display panel using an adhesive paste is added.

Furthermore, the organic light emitting display device has a problem that it becomes thicker due to an encapsulating substrate encapsulating an organic light emitting diode and a touch panel.

SUMMARY OF THE INVENTION

Accordingly, one aspect provides an organic light emitting display device, which may make a display panel being integrated with a touch panel by directly forming the touch panel on the display panel.

It is a second object to provide an organic light emitting display device, which reduces a thickness by forming an encapsulating substrate encapsulating an organic light emitting diode with an encapsulating thin film.

It is a third object to provide an organic light emitting display device, which may improve the mechanical reliability of an encapsulating thin film by forming a protection film as the highest layer of a touch panel.

Some embodiments provide an integrated display and touch input device comprising a display, for example, an organic light emitting display, on which a set of third electrodes of the touch input device is disposed on an upper surface of the display and a set of fourth electrodes of the touch input device are disposed on an upper substrate. A spacing member defines a space between the third and fourth electrodes. In some embodiments, the third and fourth electrodes are configured such that an external pressure on the upper substrate results in contact between the third and fourth electrodes, which generates a signal that is converted into a location on the display device. Embodiments of the integrated display and touch input device are thinner and/or easier to manufacture.

The foregoing and/or other aspects are achieved by providing an organic light emitting display device, comprising: a display panel including a substrate having at least one organic light emitting diode and an encapsulating thin film for encapsulating the organic light emitting diode; and an external input device formed on the display panel for generating an electric signal in response to a touch operation applied from an exterior, wherein the external input device includes an upper substrate and a spacing member, the upper substrate having a third electrode formed on the display panel and a fourth electrode formed to intersect the third electrode, and the spacing member forming a predetermined spacing between the third electrode and the fourth electrode.

Preferably, the upper substrate may be a transparent film, and the transparent film may comprise at least one of Indium Tin Oxide (ITO), IZO (Indium Zinc Oxide), Indium Zinc Tin Oxide (IZTO), ICO (Indium Cesium Oxide), and IWO (Indium Tungsten Oxide). More preferably, the third electrode may be formed in a dot or stripe shape, and the fourth electrode may be formed in a dot or stripe shape. Most preferably, a plurality of third electrodes and a plurality of fourth electrodes may be spaced from each other. The organic light emitting display device may further include a pressure conductive member disposed between the third electrode and the fourth electrode. Also, the pressure conductive member may be formed at a front surface of the third electrode, the pressure conductive member may be elastically transformed under external pressure, and the pressure conductive member may be a composite material made by dispersing conductive fine-particle metal in silicon rubber.

Further, the encapsulating thin film may include at least one organic layer and at least one inorganic layer, which are alternately stacked, the organic layer may be one selected from the group consisting of epoxy, acrylate, and urethane acrylate, and the inorganic layer may be one selected from the group consisting of $Al_xO_y$ and $Si_xO_y$. The organic light emitting display device may further include a protection film disposed between the substrate including the organic light emitting diode and the encapsulating thin film. The protection film may be an inorganic layer.

The spacing member may be interposed between the display panel and a touch panel, and the spacing member may be a frit.

Some embodiments provide an organic light emitting display device, comprising: a display panel comprising a substrate comprising at least one organic light emitting diode, and an encapsulating thin film encapsulating the organic light emitting diode; and an external input device disposed on the display panel operable for generating an electric signal in response to external pressure, wherein the external input device comprises an upper substrate, a spacing member, a third electrode disposed on the display panel, and a fourth electrode disposed on the upper substrate to intersect the third electrode, wherein the spacing member defines a predetermined spacing between the third electrode and the fourth electrode.

In some embodiments, the upper substrate comprises a transparent film. In some embodiments, the transparent film comprises at least one of Indium Tin Oxide (ITO), IZO (Indium Zinc Oxide), Indium Zinc Tin Oxide (IZTO), ICO (Indium Cesium Oxide), and IWO (Indium Tungsten Oxide).

In some embodiments, the third electrode is a dot or a stripe. In some embodiments, the fourth electrode is a dot or a stripe. Some embodiments comprise a plurality of third electrodes and a plurality of fourth electrodes spaced from each other.

Some embodiments further comprise a pressure conductive member disposed between the third electrode and the fourth electrode. In some embodiments, the pressure conductive member is disposed on a front surface of the third electrode. In some embodiments, the pressure conductive member elastically deforms under external pressure. In some embodiments, the pressure conductive member comprises a composite material comprising a conductive fine-particle metal dispersed in silicone rubber.

In some embodiments, the encapsulating thin film comprises at least one organic layer and at least one inorganic layer, which are alternately stacked. In some embodiments, the organic layer comprises at least one of epoxy, acrylate, and urethane acrylate. In some embodiments, the inorganic layer comprises at least one of $Al_xO_y$ and $Si_xO_y$.

Some embodiments further comprise a protection film disposed between the substrate comprising the organic light emitting diode, and the encapsulating thin film. In some embodiments, the protection film comprises an inorganic layer.

In some embodiments, the spacing member is circumferentially disposed between the encapsulating thin film and the upper substrate. In some embodiments, the spacing member comprises a frit.

BRIEF DESCRIPTION OF THE DRAWINGS

These and/or other embodiments and features will become apparent and more readily appreciated from the following description of certain exemplary embodiments, taken in conjunction with the accompanying drawings of which.

DETAILED DESCRIPTION OF CERTAIN EMBODIMENTS

Figure 1:
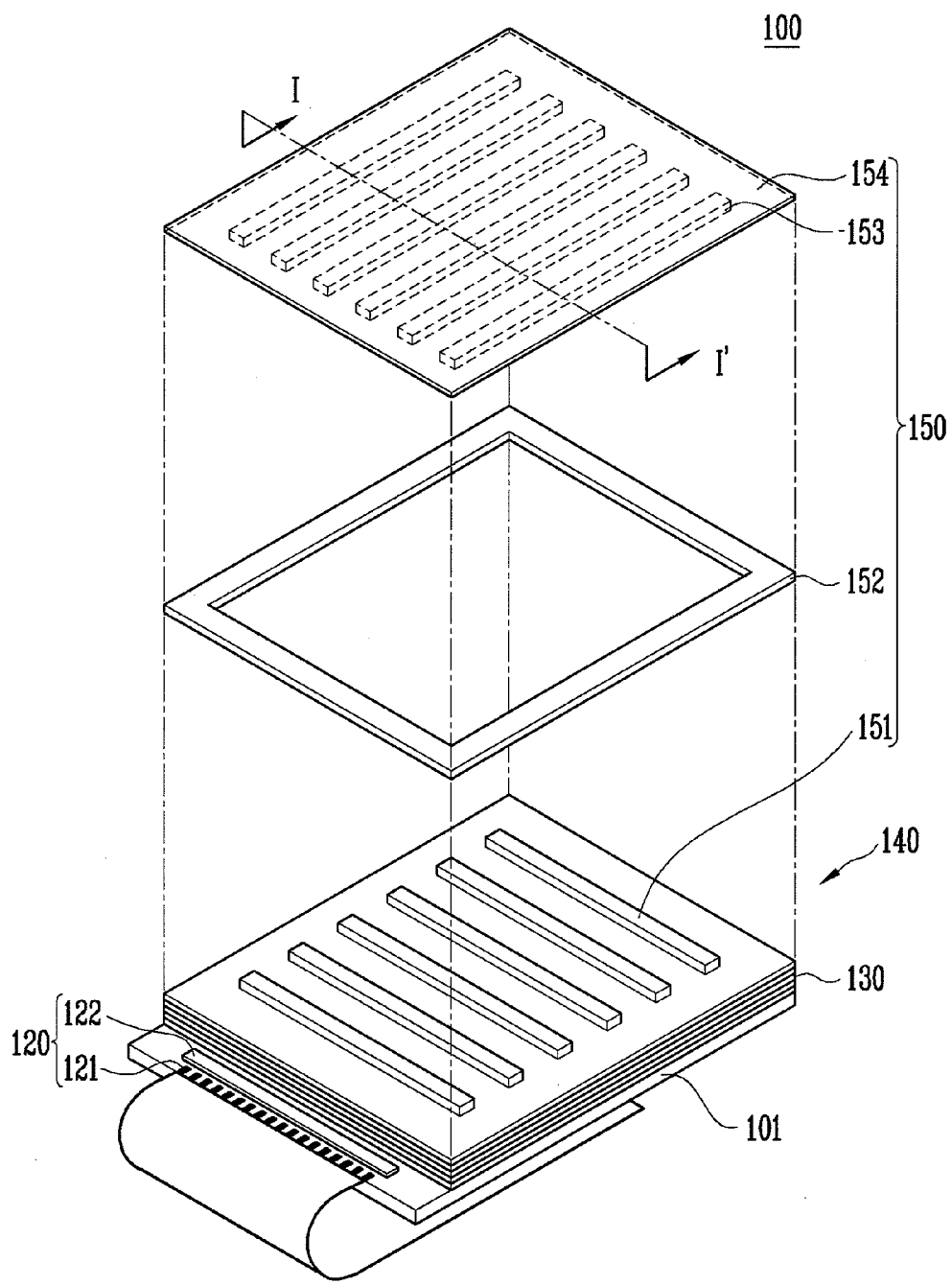
FIG. 1 is a perspective exploded view schematically showing an organic light emitting display device according to a first embodiment.

Hereinafter, exemplary embodiments of an organic light emitting display device including a touch panel will be described with reference to the accompanying drawings. Here, when a first element is coupled to a second element, the first element may be not only directly coupled to the second element but also indirectly coupled through one or more other elements. Further, elements not needed for an understanding of the illustrated embodiments are omitted for clarity. Also, like reference numerals refer to like elements throughout.

Figure 2:
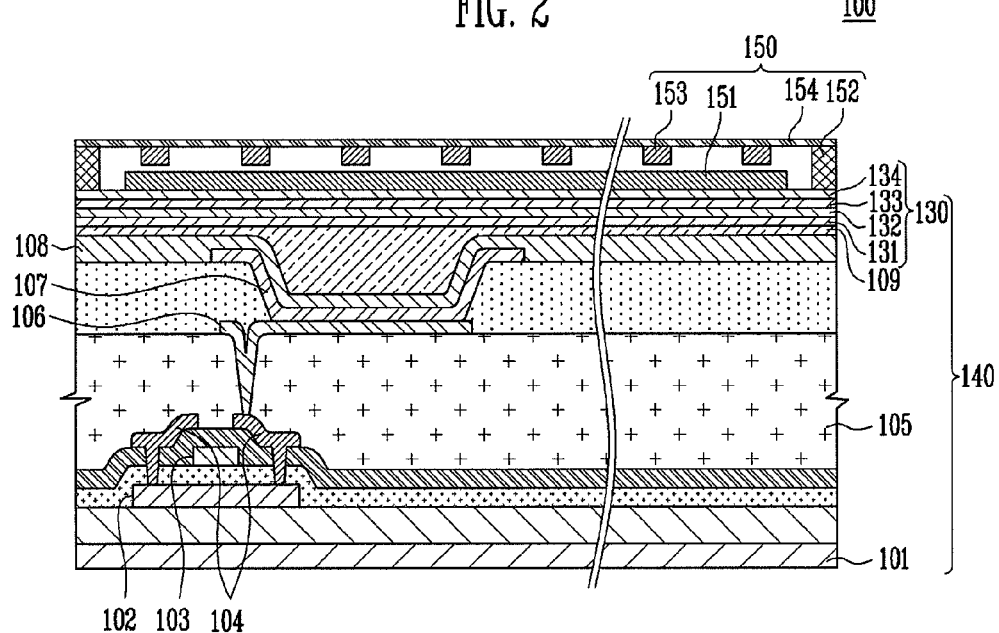
FIG. 2 is a cross-sectional view of the organic light emitting display device taken along section line I-I' of FIG. 1.

FIG. 1 is an exploded perspective view schematically showing an organic light emitting display device according to a first embodiment. FIG. 2 is a cross-sectional view of the organic light emitting display device taken along section line I-I' of FIG. 1.

With reference to FIG. 1 and FIG. 2, the organic light emitting display device 100 includes a display panel 140 and an external input device 150. The display panel 140 includes a substrate 101 having at least one organic light emitting diode and an encapsulating thin film 130 for encapsulating the organic light emitting diode. The external input device 150 is formed on the display panel 140, and generates an electric signal in response to a touch operation applied from an exterior. Here, the external input device 150 includes a protection film 154 and a spacing member 152. The protection film 154 has a third electrode 151 formed on the display panel 140 and a fourth electrode 153 formed to intersect the third electrode 151. The spacing member 152 forms a predetermined space between the third electrode 151 and the fourth electrode 153.

The display panel 140 comprises a pixel region and a non-pixel region. The pixel region includes at least one thin film transistor formed on the substrate 101, and an organic light emitting diode electrically coupled to the thin film transistor. The non-pixel region includes a driving circuit 122 and a pad portion 121.

A scan line, a data line, and an organic light emitting diode are formed on the pixel region of the display panel. The organic light emitting diode is coupled to each of the scan line and the data line, and constitutes a pixel.

A scan line, a data line, a power supply line for operating the organic light emitting diode, a scan driver, and a data driver are formed on the non-pixel region. The scan line and the data line extend from the scan line and the data line of the non-pixel region. The driving circuit 122, namely, a scan driver and a data driver, process external signals through the pad portion 121, and supply the processed signals to the scan line and the data line, respectively. The aforementioned driving circuit 122 may be mounted on a Flexible Printed Circuit Board (FPCB) electrically coupled to a display panel unit through the pad portion 121 or on the display panel in a form of an integrated circuit (IC) chip.

Hereinafter, a thin film transistor and organic light emitting diode formed on the substrate 101 will be described in detail with reference to FIG. 2. The thin film transistor comprises a buffer layer comprising an oxide layer is formed on the substrate 101. After a poly-silicon layer is formed on the buffer layer, it is patterned to form a semiconductor layer 102. A gate insulating layer is formed on the buffer layer on which the semiconductor layer 102 is formed, and a gate electrode 103 is formed on the gate insulating layer. An interlayer insulation layer is formed on the gate electrode 103, and source and drain electrodes 104 are formed on the interlayer insulation layer. Here, the source and drain electrodes 104 are coupled to source and drain regions of the semiconductor layer 102, respectively. A planarization layer 105 is formed on the interlayer insulation layer on which the source and drain electrodes 104 are formed. An organic light emitting diode is formed on the planarization layer 105, and electrically coupled to a thin film transistor. Here, the organic light emitting diode includes a first electrode 106, an emission layer 107, and a second electrode 108. Referring to FIG. 1, the pad portion 121 and the driving circuit 122 may be formed on the non-pixel region of the substrate 101. A data line and a power line may be formed in the pad portion 121. Here, the data line functions to supply signals to the organic light emitting diode, which is formed in the pixel region.

Meanwhile, an encapsulating thin film 130 is formed over a surface of the organic light emitting diode opposite from the substrate 101 and spaced apart from the second electrode 108 by a predetermined distance. Here, the encapsulating thin film 130 functions to protect the organic light emitting diode. The encapsulating thin film 130 is formed by alternately stacking at least one organic layer and one inorganic layer to prevent moisture and oxygen from penetrating into the organic light emitting diode. The encapsulating thin film 130 is from about 1 μm to about 10 μm thick, which can be reduced to approximately 1/30 of that of an encapsulating substrate having a thickness greater than 200 μm.

Furthermore, a protection film 109 is formed between the second substrate 108 and the encapsulating thin film 130. The protection film 109 is formed covering an entire surface of the substrate 101 on which the organic light emitting diode is formed, which may be made of inorganic materials. The protection film 109 planarizes a contact surface between the substrate 101 on which the second electrode 108 and the encapsulating thin film 130, and may adhere the substrate 101 to the encapsulating thin film 130.

The encapsulating thin film 130 will be now explained in detail. A first organic layer 131, a first inorganic layer 132, a second organic layer 133, and a second inorganic layer 134 are alternately stacked on the protection film 109 at least four times in a repeated manner, thereby efficiently reducing the penetration of moisture and oxygen from the exterior. The first and second organic layers 131 and 132 of the encapsulating thin film 130 prevent nano crack and/or micro crack defects from propagating continuously in the first and second inorganic layers 132 and 134, which would otherwise extend a penetration path of the moisture and oxygen therethrough, thereby reducing moisture permeability and stress remaining in the first and second inorganic layers 132 and 134. Each of the first and second organic layers 131 and 133 comprises at least one of epoxy, acrylate, and urethane acrylate. Each of the first and second inorganic layers 132 and 134 comprises at least one of $Al_xO_Y$ and $Si_xO_Y$.

Moreover, an external input device 150 is provided on the display panel 140. The external input device 150 digitally detects an input position of a pen or finger, and converts the input position into X and Y coordinates. The external input device 150 may be generally classified into a capacitive type and a resistive type. The external input device 150 may be generally classified into a touch panel, a tablet, and a digitizer. In an embodiment of the present invention, a touch panel 150 of a resistive-type external input device is shown.

The touch panel 150 includes a protection film 154 and a spacing member 152. A plurality of third electrodes 151 spaced from each other is formed on the display panel 140 in a stripe pattern in a first direction. A plurality of fourth electrodes 153 is formed on the protection film 154 in a second direction that intersects the third electrodes 151. The spacing member 152 spaces the third electrodes 151 and the fourth electrodes 153 apart from each other greater than a predetermined distance. In some embodiments, the first direction of the display panel 140 on which the third electrodes 151 are formed means a direction horizontal or perpendicular to one of four sides of the display panel 140. The second direction in which the fourth electrodes 153 extend are about 90 degrees (vertically) from the direction of the third electrodes 151 in the illustrated embodiment.

The spacing member 152 is interposed between the display panel 140 and a touch panel 150. The spacing member comprises an adhesive material, for example, a frit or an adhesive tape. The spacing member 152 can adhere the protection film 154 to the display panel 140, spaced apart from each other by a predetermined distance. Here, the third electrodes 151 are formed on the display panel 140 and the fourth electrodes 153 are formed on the protection film 154. As described above, as the third electrodes 151 are formed on the display panel 140 without forming a lower substrate for forming the third electrodes 151. Consequently, manufacture of the display panel 140 may be integrated with manufacture of the touch panel 150, and the number of processes may be reduced. Since a lower substrate is not needed for the touch panel 150 according to the present embodiment, a thickness of the touch panel 150 and a transmission path of light emitted from the organic light emitting diode may be reduced.

Meanwhile, since a protection film 154 forms an upper substrate at the highest layer of the touch panel 150, the total thickness of the touch panel 150 may be thinner. Namely, thickness of the protection film 154 is from about 1/10 to 1/2 of the thickness of a typical upper substrate, which is formed of plastic or glass, thereby reducing the thickness of the touch panel 150.

In addition, the protection film 154 is formed of a transparent film having high hardness in order to protect the encapsulating thin film 130. That is, the highest layer of the touch panel 150 is formed of materials having high hardness, thereby preventing the encapsulating thin film 130 from being damaged due to external pressure.

The protection film 154 comprises at least one of Indium Tin Oxide (ITO), IZO (Indium Zinc Oxide), Indium Zinc Tin Oxide (IZTO), ICO (Indium Cesium Oxide), IWO (Indium Tungsten Oxide) to provide the desired hardness of the encapsulating thin film 130. For example, the protection film 154 may be formed by materials having hardness of about 10,000 to 1,000,000 times higher than the hardness of the encapsulating thin film 130. As illustrate earlier, the protection film 154 is formed from materials harder than the encapsulating thin film 130, thereby preventing the encapsulating thin film 130 from being damaged by external shock or pressure.

Figure 3:
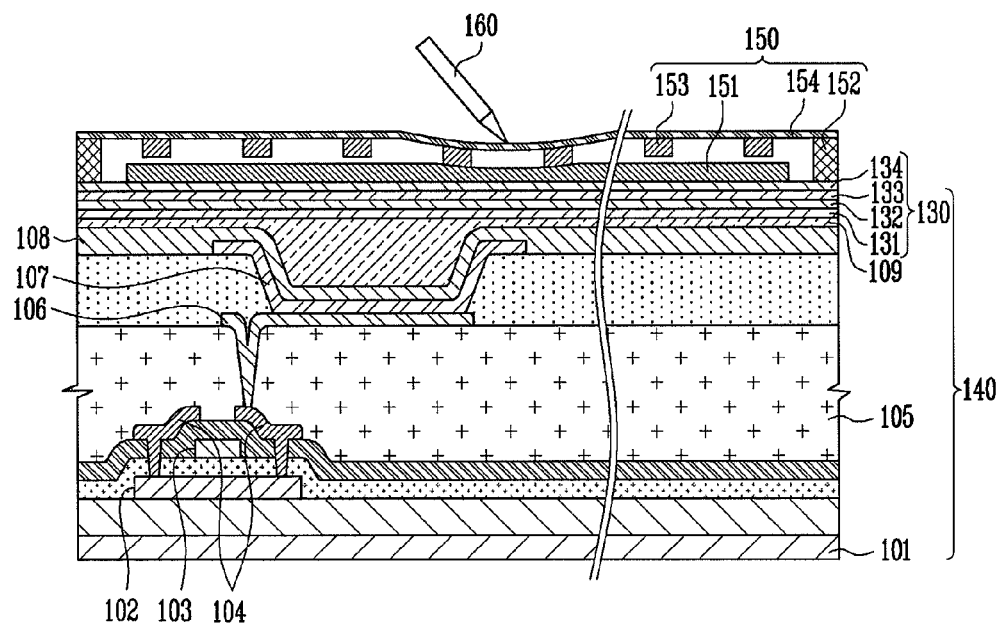
FIG. 3 is a cross-sectional view showing an operation state of an organic light emitting display device including a touch panel according to a first embodiment.

FIG. 3 is a cross-sectional view showing an operation state of an organic light emitting display device including a touch panel according to a first embodiment. Referring to FIG. 3, the following is the explanation of an operation state of the organic light emitting display device including the touch panel according to the first embodiment. By pressing the protection film 154 on which the fourth electrode 153 is disposed using an input means such as a pen 160 or a finger (not shown), the fourth electrode 153 contacts with the third electrode 154. As described above, the touch operation presses the protection film 154, thereby electrically contacting the fourth electrode 153 with the third electrode 151. Accordingly, an electric signal is detected based on a resistance value of a contacted position, which is transmitted to an internal or external integrated circuit (IC) through a connector that leads to an embodiment of the touch panel.

FIG. 4A to FIG. 4E are cross-sectional views illustrating a method of manufacturing an organic light emitting display device according to the first embodiment.

Figure 4A:
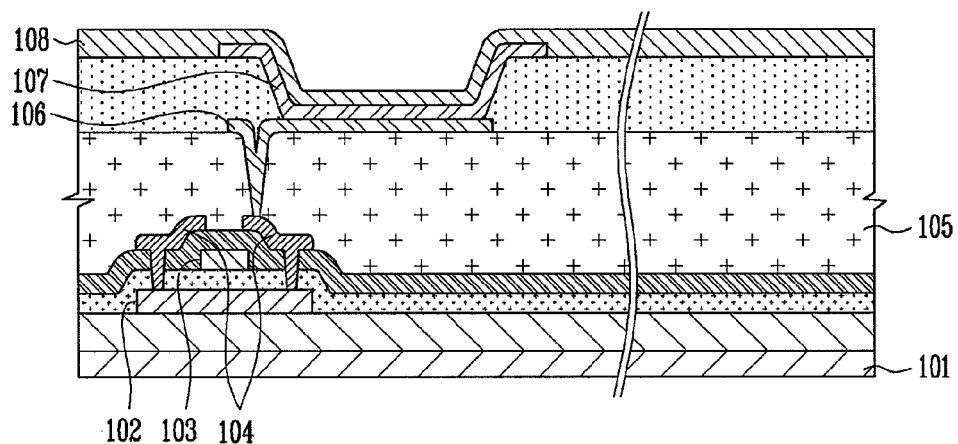
FIG. 4A to FIG. 4E are cross-sectional views illustrating a method of manufacturing an organic light emitting display device according to the first embodiment.

With reference to FIG. 4A, a buffer layer is formed on the substrate 101. A thin film transistor is formed on the buffer layer. Here, the thin film transistor includes a semiconductor layer 102, a gate electrode 103, and source/drain electrodes 104. The semiconductor layer 102 is formed on the buffer layer in a predetermined pattern. The semiconductor layer 102 is coated to a thickness of approximately 300 to 2000 Å with silicon or a material selected from organic materials by a chemical vapor deposition (CVD), and is patterned in a predetermined shape. A gate insulating layer is formed on an entire surface of the semiconductor layer 102. On the gate insulating layer, a gate electrode 103 is formed at an upper portion corresponding to a channel region of the semiconductor layer 102. Conductive metal is deposited on the gate insulating layer to a thickness of about 200 to 3000 Å, and is patterned in a predetermined shape. Here, examples of suitable conductive metals include aluminum (Al), MoW, molybdenum (Mo), copper (Cu), silver (Ag), aluminum alloy, and/or silver alloy. An interlayer insulation layer is formed on the gate insulating layer in the same manner as the gate insulating layer.

The source/drain electrodes 104 are formed on the interlayer insulation layer, and are electrically coupled to source and drain regions of the semiconductor layer 102 through contact holes formed in the gate insulating layer and the interlayer insulation layer. A planarization layer 105 is formed on the source/drain electrodes 104. The planarization layer 105 comprises at least one of acryl, polyimide, and benzocyclobutene (BCB). An organic light emitting diode is formed on the planarization layer 105. Here, the organic light emitting diode includes a first electrode, an emission layer 107, and a second electrode 108.

Figure 4B:
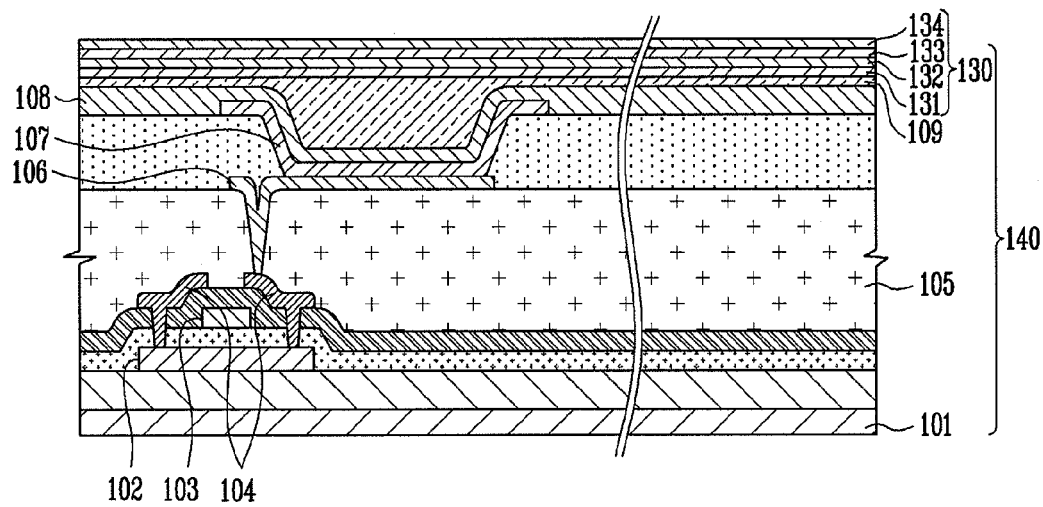

With reference to FIG. 4B, a passivation layer 109 is formed on the second electrode 108. The passivation layer 109 may be formed of inorganic materials, and planarizes the substrate 101 on which the second electrode 108 is formed. An encapsulating thin film 103 is formed on the passivation layer 109. The encapsulating thin film 130 is formed by alternately stacking at least one organic layer and at least one inorganic layer. The encapsulating thin film 130 comprises a first organic layer 131, a first inorganic layer, a second organic layer 133, and a second inorganic layer 134. The encapsulating thin film 130 may be formed by at least one of ion beam assisted sputtering, electron-beam deposition, plasma enhanced chemical vapor deposition (PECVD), radio frequency (RF) sputtering, and atomic layer deposition.

Figure 4C:
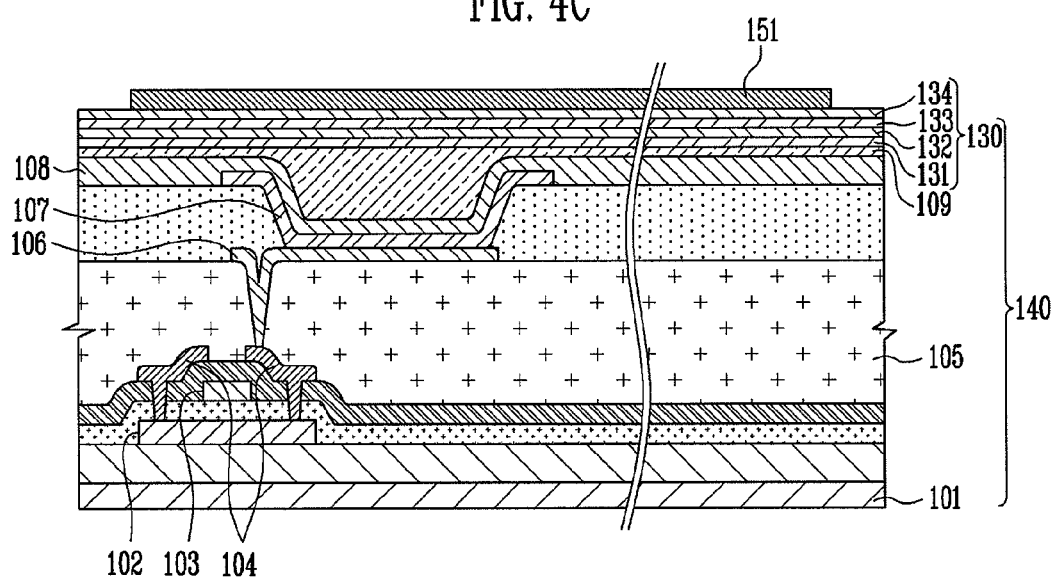

Referring to FIG. 4C, a third electrode 151 is formed on the encapsulating thin film 130. A plurality of third electrodes 151 is formed in a first direction on the encapsulating thin film 130 in stripes spaced apart from each other by a predetermined distance.

The third electrode 151 may be formed of a transparent conductive material, for example, at least one of Indium Tin Oxide (ITO), IZO (Indium Zinc Oxide), Indium Zinc Tin Oxide (IZTO), ICO (Indium Cesium Oxide), and IWO (Indium Tungsten Oxide).

Figure 4D:
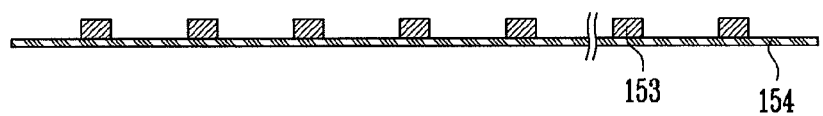

With reference to FIG. 4D, a fourth electrode 153 is formed on the protection film 154. Plural electrodes are formed in a second direction crossing the first direction in which the third electrode 151 is formed. And, the fourth electrode 153 may be formed of the same material as the third electrode 151.

Figure 4E:
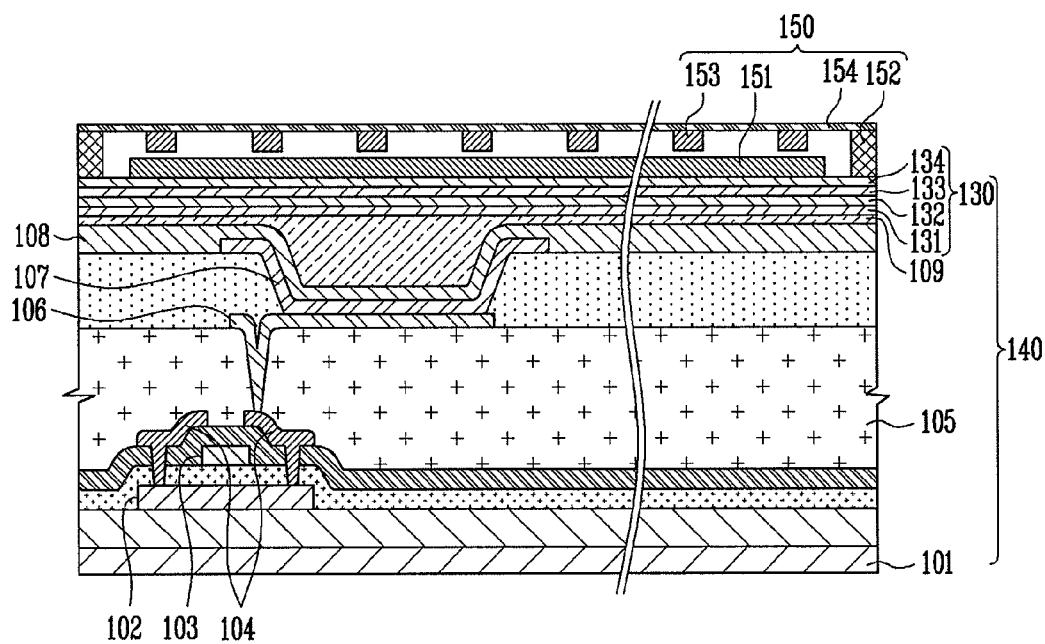

With reference to FIG. 4E, a periphery of the protection film 154 or a periphery of the encapsulating thin film 130 is coated with a spacing member, namely, a sealant 152, thereby adhering the protection film 154 on which the fourth electrode 154 is disposed to the encapsulating thin film 130 on which the third electrode 152 is formed. As a result, the organic light emitting display device 100 integrated with the touch panel 150 can be provided.

Figure 5:
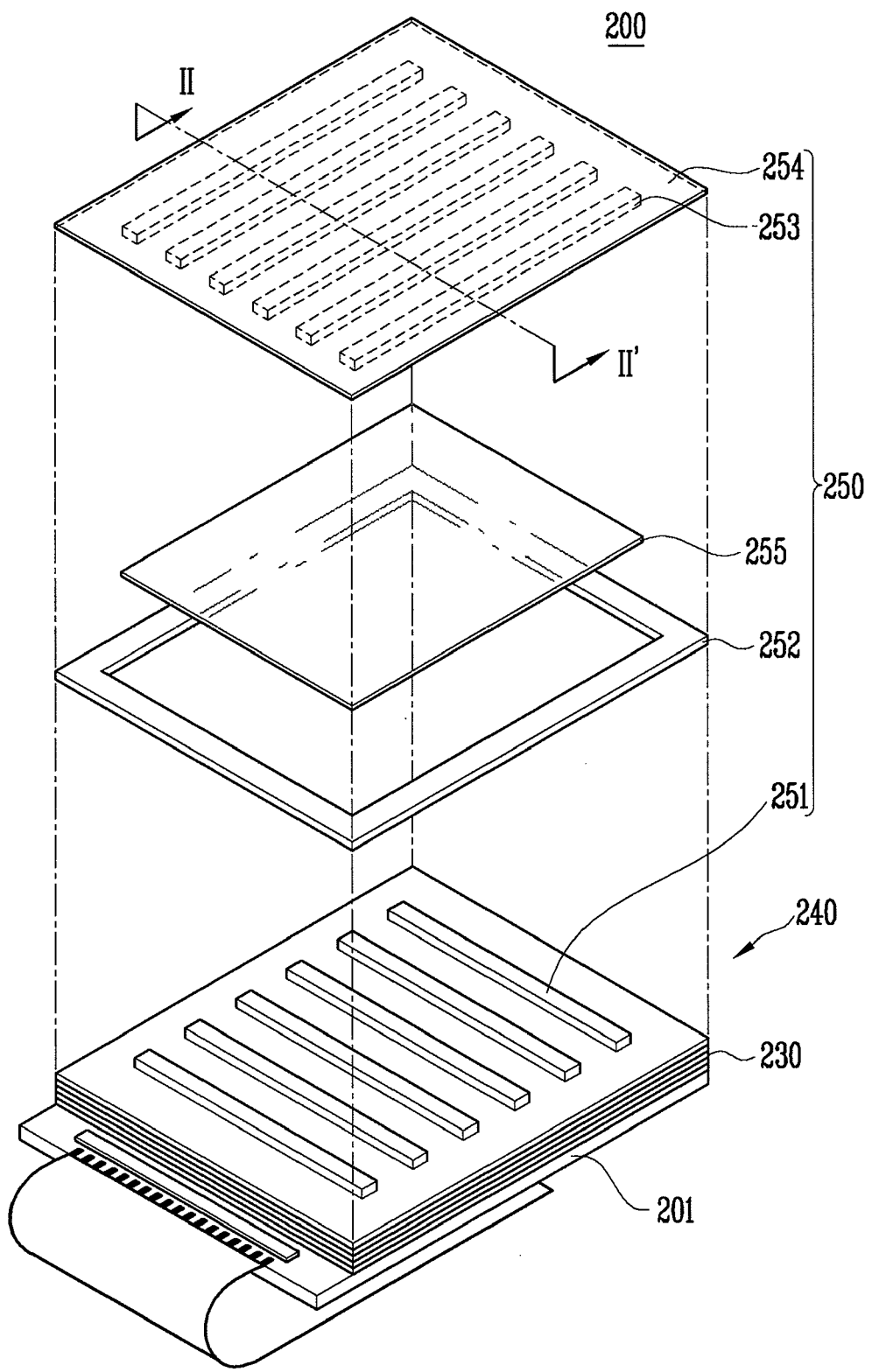
FIG. 5 is a perspective exploded view schematically showing an organic light emitting display device according to a second embodiment.
Figure 6:
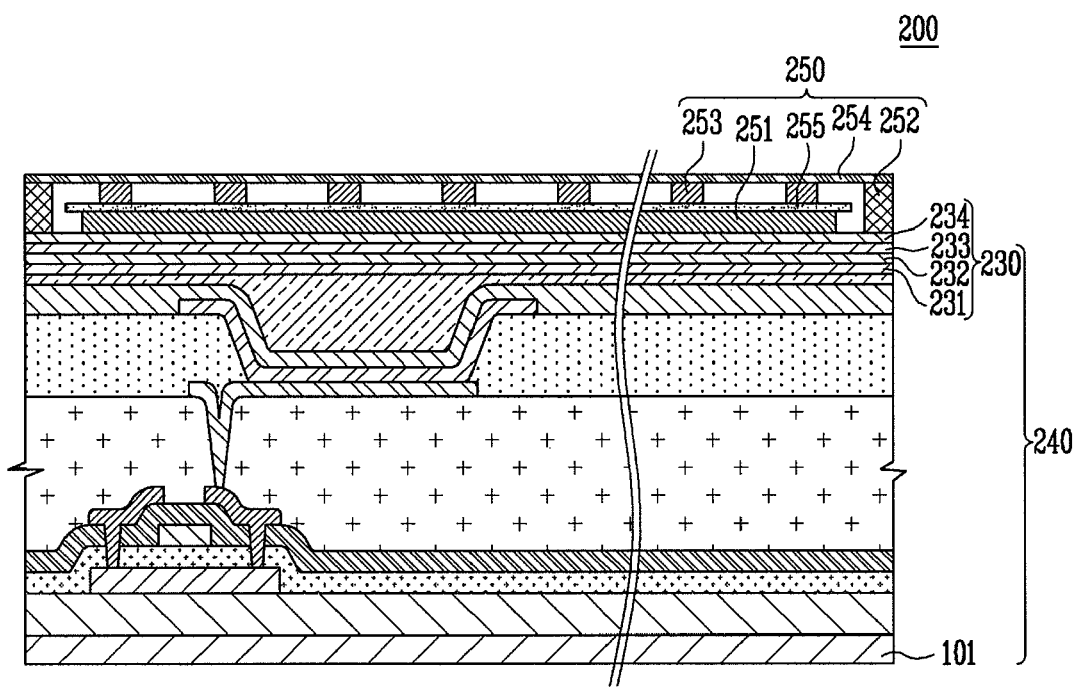
FIG. 6 is a cross-sectional view of the organic light emitting display device taken along section line II-II' of FIG. 5.

FIG. 5 is a perspective exploded view schematically showing an organic light emitting display device according to a second embodiment. FIG. 6 is a cross-sectional view of the organic light emitting display device taken along section line II-II' of FIG. 5.

With reference to FIG. 5 and FIG. 6, the organic light emitting display device 200 includes a display panel 240 and an external input device 250. The display panel 240 includes a substrate 201 having at least one organic light emitting diode and an encapsulating thin film 230 for encapsulating the organic light emitting diode. The external input device 250 is formed on the display panel 240, and generates an electric signal in response to a touch operation applied from the exterior thereof. Here, the external input device 250 includes a protection film 254 and a spacing member 252. The external input device 250 has a third electrode 251 formed on the display panel 240 and a fourth electrode 253 formed on the protection film 254 to intersect the third electrode 251. The spacing member 252 forms a predetermined spacing between the third electrode 251 and the fourth electrode 254.

The encapsulating thin film 230 may be formed by alternately stacking a first organic layer 231, a first inorganic layer 232, a second organic layer 233, and a second inorganic layer 234. The second embodiment is substantially similar to the first embodiment, further comprising a pressure conductive member 255 provided between the third electrode 251 and the fourth electrode 253.

The pressure conductive member 255 is formed between the third electrode 252 and the fourth electrode 253, namely, over an entire surface of the third electrode 251, thereby adhering the protection film 254 including the fourth electrode 253 to the encapsulating substrate 230. Here, the third electrode 251 is formed on the encapsulating substrate 230. Further, the pressure conductive member 255 can be formed at a peripheral region of the third electrode 252 and a peripheral region of the fourth electrode 253. Here, if the protection film 254 sags, the fourth electrode 253 contacts with the third electrode 251. In order to prevent the fourth electrode 253 from contacting with the third electrode 251, transparent insulation materials are formed between a plurality of third electrodes 251 or a plurality of fourth electrodes 253, which allows the fourth electrode 253 to be spaced apart from the third electrode 251. As explained earlier, the pressure conductive member 255 is interposed between the third electrode 251 and the fourth electrode 254 in order to enhance the mechanical reliability of the touch panel 250. The pressure conductive member 255 has an elasticity such that when a shock or force from an upper portion of the touch panel 205 is applied thereto, the pressure conductive member 255 returns to the original state when the applied shock or force is removed. The pressure conductive member 255 has transparency and adhesion. In some embodiments, the pressure conductive member 255 comprises a composite material obtained by dispersing a conductive, fine-particle metal in silicone rubber. Embodiments of the pressure conductive 255 member are coated with a conductive fine-particle metal in a form of a thin film or manufactured in a form of a film. By pressing the pressure conductive member 255 using an input means such as a pen or a finger to apply force to the pressure conductive member 255, the third electrode 251 and the fourth electrode 253 are electrically coupled. Accordingly, an electric signal is detected based on a resistance value of a contacted position, and is transmitted to an IC through a connector. The IC calculates and processes the detected voltage into coordinates.

As mentioned above, as the pressure conductive member 255 is further formed between the third electrode 251 and the fourth electrode 254. Further, a uniform spacer 252 can be formed between the protection film 254, to which the fourth electrode 253 may be more uniformly adhered, and the display panel 240, on which the third electrode 251 is formed. In addition, the pressure conductive member 255 is interposed between the third electrode 251 and the fourth electrode 253 to prevent an air layer from being formed between the third electrode 251 and the fourth electrode 253, with the result that degradation in quality of images displayed by the display panel 240 can be reduced and/or prevented.

Figure 7:
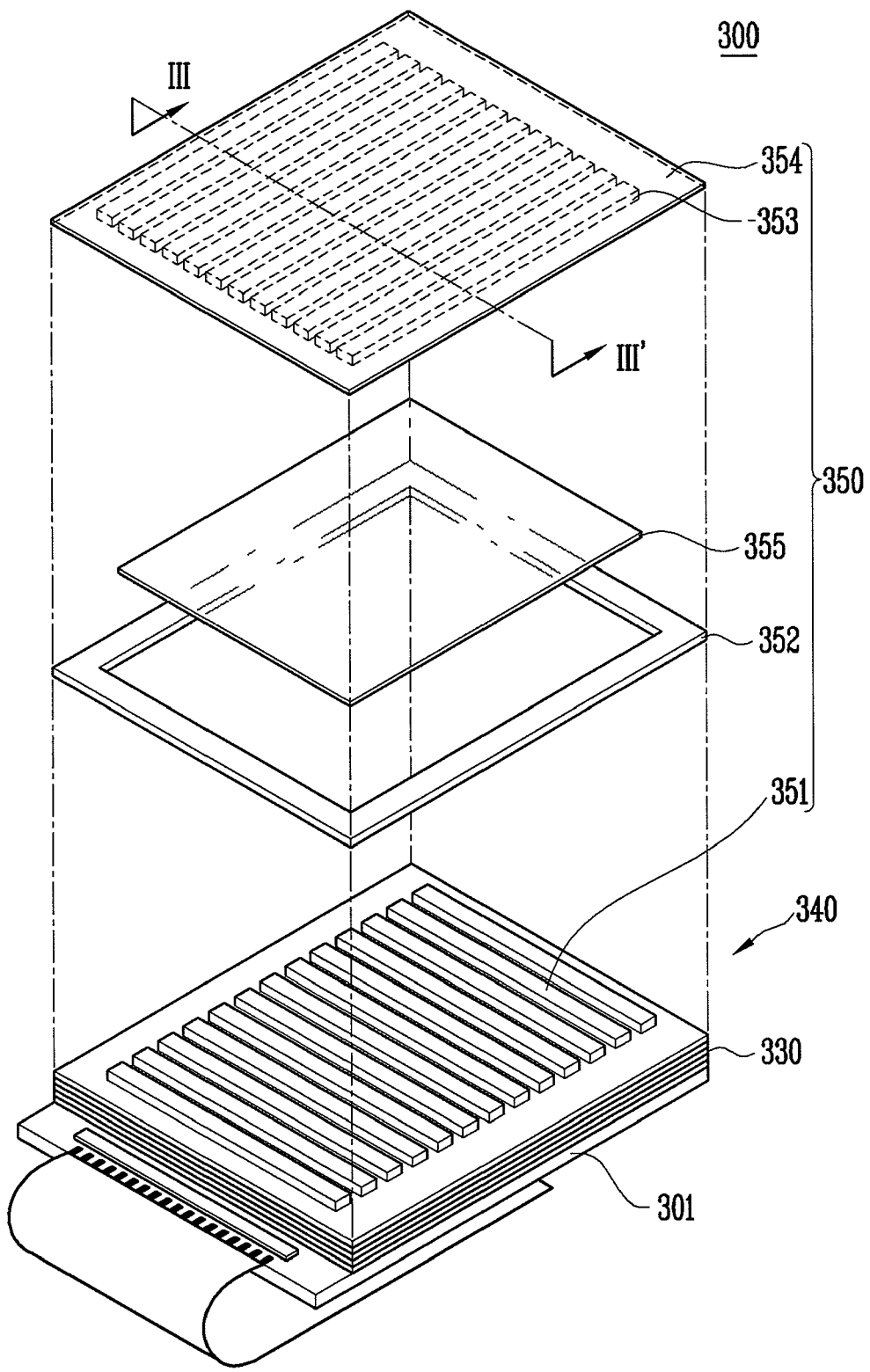
FIG. 7 is a perspective exploded view schematically showing an organic light emitting display device according to a third embodiment.
Figure 8:
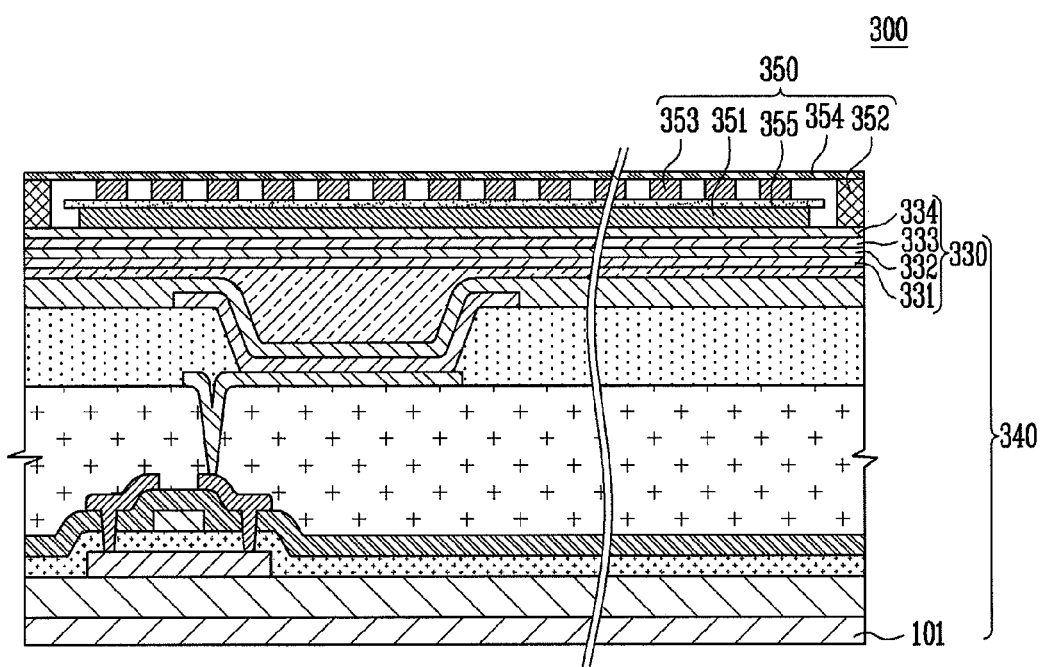
FIG. 8 is a cross-sectional view of the organic light emitting display device taken along section line III-III' of FIG. 7.

FIG. 7 is a perspective exploded view schematically showing an organic light emitting display device according to a third embodiment. FIG. 8 is a cross-sectional view of the organic light emitting display device taken along section line III-III' of FIG. 7.

With reference to FIG. 7 and FIG. 8, the organic light emitting display device 300 includes a display panel 340 and an external input device 350. The display panel 340 includes a substrate 301 having at least one organic light emitting diode and an encapsulating thin film 330 for encapsulating the organic light emitting diode. The external input device 350 is formed on the display panel 340, and generates an electric signal in response to a touch operation applied from the exterior thereof. Here, the external input device 350 includes a protection film 354 and a spacing member 352. The external input device 350 has a third electrode 351 formed on the display panel 340 and a fourth electrode 353 formed to intersect the third electrode 351. The spacing member 352 forms a predetermined spacer between the third electrode 351 and the fourth electrode 353.

The encapsulating thin film 330 may be formed by alternately stacking a first organic layer 331, a first inorganic layer 332, a second organic layer 333, and a second inorganic layer 334. The third embodiment of the present invention is substantially to the second embodiment, with a greater number of third electrodes 351 formed on the encapsulating thin film 330, and a greater number of fourth electrodes 353 formed on the protection film 354. The increased number of third electrodes 351 is increased by reducing the spacing therebetween. The number of fourth electrodes 353 is also increased by reducing the spacing therebetween.

As described earlier, the more closely spaced third electrodes 351 and the fourth electrodes 353 in the third embodiment, increases the resolution and operating characteristics of the touch panel 350.

Figure 9:
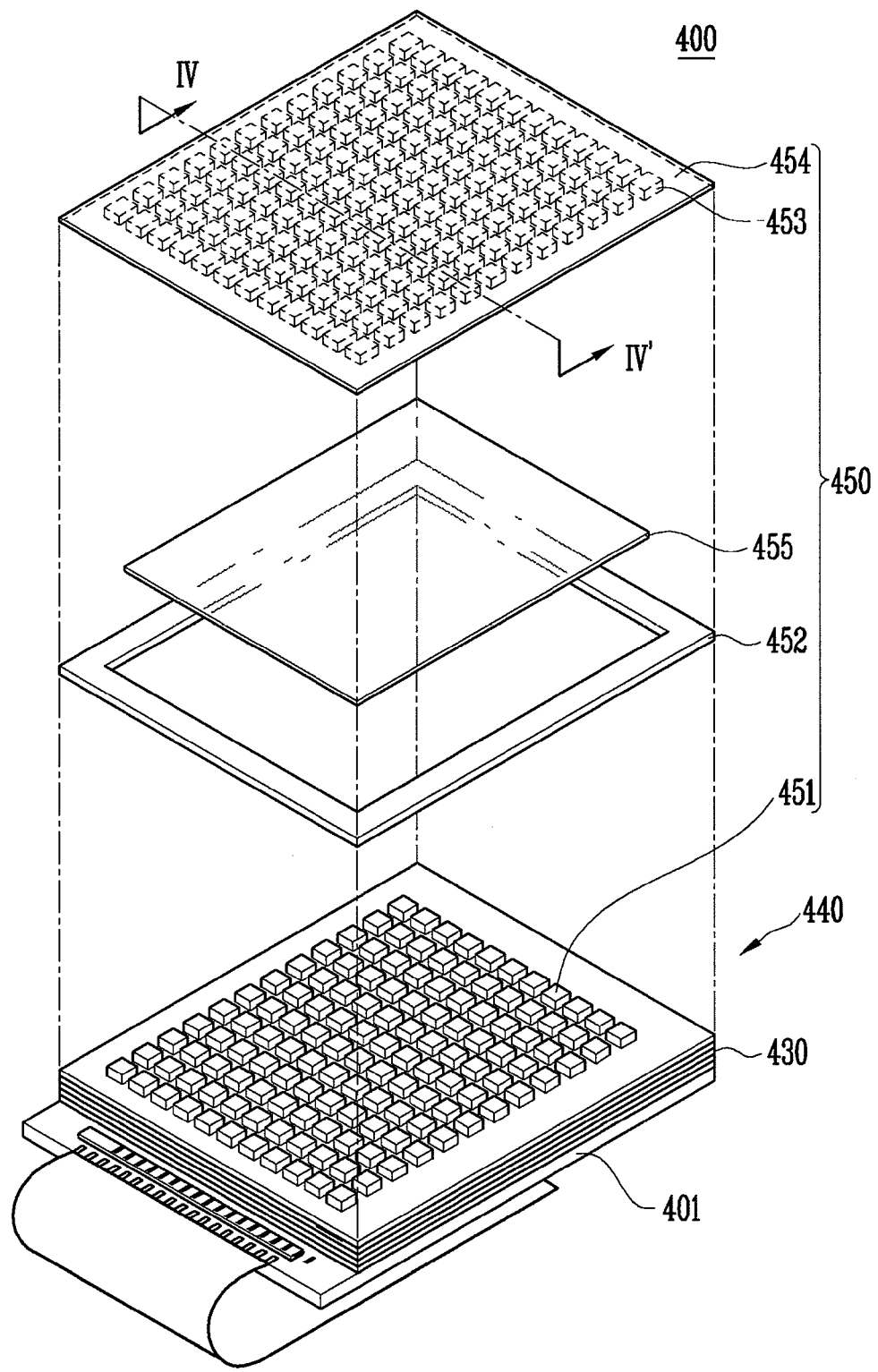
FIG. 9 is a perspective exploded view schematically showing an organic light emitting display device according to a fourth embodiment.
Figure 10:
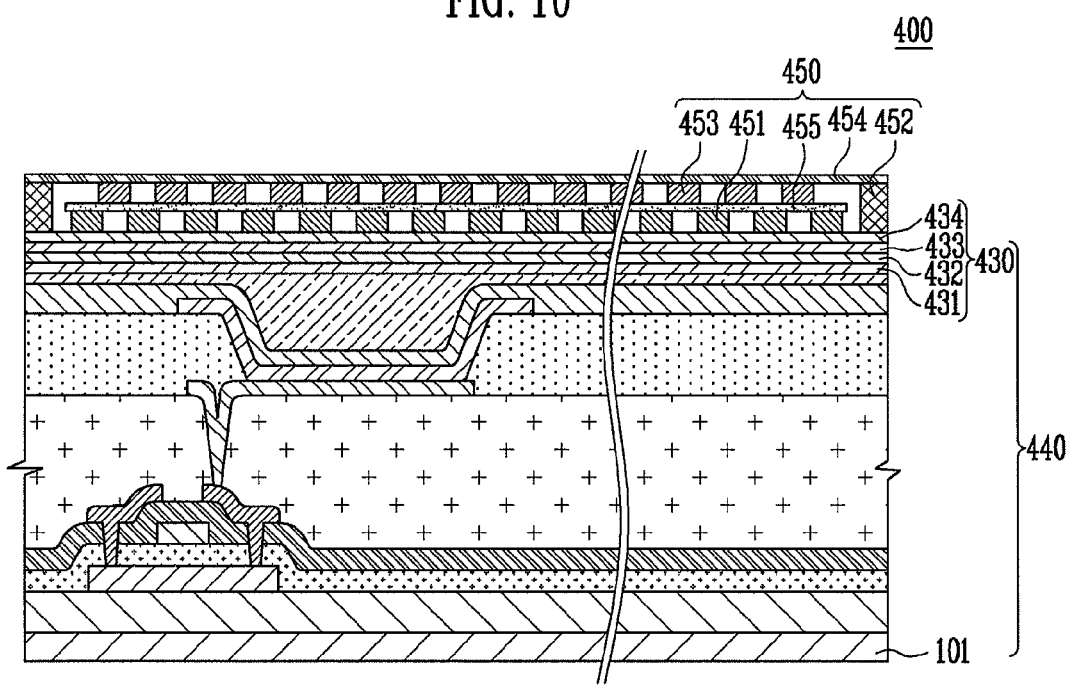
FIG. 10 is a cross-sectional view of the organic light emitting display device taken along section line IV-IV' of FIG. 9.

FIG. 9 is a perspective exploded view schematically showing an organic light emitting display device according to a fourth embodiment. FIG. 10 is a cross-sectional view of the organic light emitting display device taken along section line IV-IV' of FIG. 9.

With reference to FIG. 9 and FIG. 10, the organic light emitting display device 400 includes a display panel 440 and an external input device 450. The display panel 440 includes a substrate 401 having at least one organic light emitting diode and an encapsulating thin film 430 for encapsulating the organic light emitting diode. The external input device 450 is formed on the display panel 440, and generates an electric signal in response to a touch operation applied from the exterior thereof. Here, the external input device 450 includes a protection film 454 and a spacing member 452. The external input device 450 has a third electrode 451 formed on the display panel 440 and a fourth electrode 453 formed to intersect the third electrode 451. The spacing member 452 forms a predetermined spacing between the third electrode 451 and the fourth electrode 453.

The encapsulating thin film 430 may be formed by alternately stacking a first organic layer 431, a first inorganic layer 432, a second organic layer 433, and a second inorganic layer 434. The third embodiment of the present invention is substantially similar to the second embodiment, the third electrodes 451 and the fourth electrodes 453 are formed in a dot pattern. The third electrodes 451 and the fourth electrodes 453 are formed in a dot pattern, thereby improving the operation resolution and operating property of the touch panel 450.

With accordance with certain embodiments, since a protection film is formed of a film having a high hardness as the highest layer, namely, an upper substrate of a touch panel, it can prevent an encapsulating thin film from being damaged. Because the upper substrate of the touch panel is formed by a film, the thickness of the touch panel is decreased, thereby reducing a total thickness of an organic light emitting display device. As third electrodes are directly formed on an encapsulating thin film without a lower substrate of the touch panel, an integrated organic light emitting display device may be provided, which can be thinner compared with a typical organic light emitting display device with a touch panel. Further, the number of components and the number of processes are reduced, thereby improving the productivity. In addition, the encapsulating thin film is formed as an encapsulating means, thereby reducing the thickness of the organic light emitting display device.

Although a organic light emitting diode display panel has be described in the embodiments, it would be appreciated by those skilled in the art that other embodiments are applicable to a Liquid Crystal Display (LCD), a Field Emission Display (FED), a Plasma Display Panel (PDP), an Electro Luminescent Display (ELD), a Vacuum Fluorescent Display (VFD), and the like.

Although certain embodiments have been shown and described, it would be appreciated by those skilled in the art that changes might be made without departing from the principles and spirit thereof, the scope of which is defined in the claims and their equivalents.

What is claimed is:
1. An organic light emitting display device, comprising:
a display panel comprising
a substrate comprising at least one organic light emitting diode that defines a recess,
an encapsulating thin film encapsulating the organic light emitting diode wherein the encapsulating thin film comprises at least one organic layer and at least one inorganic layer, which are alternately stacked;
a protective film interposed between the encapsulating thin film and the organic light emitting device wherein the protective film fills the recess and provides a planarized surface for the encapsulating thin film; and an external input device disposed on the encapsulating thin film operable for generating an electric signal in response to external pressure, wherein the external input device comprises
a third electrode disposed on the encapsulating thin film,
an upper substrate having a fourth electrode to intersect the third electrode, the upper substrate disposed on the third electrode, and
a spacing member,
wherein the spacing member defines a predetermined spacing between the third electrode and the fourth electrode, and
a pressure conductive member disposed between the third and fourth electrode.

2. The organic light emitting display device as claimed in claim 1, wherein the upper substrate comprises a transparent film.

3. The organic light emitting display device as claimed in claim 2, wherein the transparent film comprises at least one of Indium Tin Oxide (ITO), IZO (Indium Zinc Oxide), Indium Zinc Tin Oxide (IZTO), ICO (Indium Cesium Oxide), and IWO (Indium Tungsten Oxide).

4. The organic light emitting display device as claimed in claim 1, wherein the third electrode is a dot or a stripe.

5. The organic light emitting display device as claimed in claim 1, wherein the fourth electrode is a dot or a stripe.

6. The organic light emitting display device as claimed in claim 1, comprising a plurality of third electrodes and a plurality of fourth electrodes spaced from each other.

7. The organic light emitting display device as claimed in claim 1, wherein the pressure conductive member is disposed on a front surface of the third electrode.

8. The organic light emitting display device as claimed in claim 1, wherein the pressure conductive member elastically deforms under external pressure.

9. The organic light emitting display device as claimed in claim 1, wherein the pressure conductive member comprises a composite material comprising a conductive fine-particle metal dispersed in silicone rubber.

10. The organic light emitting display device as claimed in claim 1, wherein the organic layer comprises at least one of epoxy, acrylate, and urethane acrylate.

11. The organic light emitting display device as claimed in claim 1, wherein the inorganic layer comprises at least one of $Al_xO_Y$ and $Si_xO_Y$.

12. The organic light emitting display device as claimed in claim 1, further comprising a protection film disposed between the substrate comprising the organic light emitting diode, and the encapsulating thin film.

13. The organic light emitting display device as claimed in claim 12, wherein the protection film comprises an inorganic layer.

14. The organic light emitting display device as claimed in claim 1, wherein the spacing member is circumferentially disposed between the encapsulating thin film and the upper substrate.

15. The organic light emitting display device as claimed in claim 14, wherein the spacing member comprises a frit.

16. An organic light emitting display device comprising:
a display panel comprising
a substrate comprising at least one organic light emitting diode that defines a recess, and
an encapsulating thin film encapsulating the organic light emitting diode;
a protective film interposed between the encapsulating thin film and the organic light emitting device wherein the protective film fills the recess and provides a planarized surface for the encapsulating thin film; and
an external input device disposed on the display panel operable for generating an electric signal in response to external pressure,
wherein the external input device comprises
an upper substrate,
a spacing member,
a third electrode disposed on the display panel, and
a fourth electrode disposed on the upper substrate to intersect the third electrode, wherein the spacing member defines a predetermined spacing between the third electrode and the fourth electrode; and
a pressure conductive member disposed between the third electrode and the fourth electrode that electrically connects the third and fourth electrode in response to pressure on the display panel.

* * * * *